US006192903B1

(12) United States Patent
Doi et al.

(10) Patent No.: US 6,192,903 B1
(45) Date of Patent: Feb. 27, 2001

(54) SPIN-PROCESSING APPARATUS AND SPIN-PROCESSING METHOD

(75) Inventors: Tsutomu Doi; Yoshiaki Kurokawa; Naoaki Sakurai, all of Yokohama (JP)

(73) Assignees: Shibaura Mechatronics Corporation; Kabushiki Kaisha Toshiba, both of Kanagawa-Ken (JP)

( * ) Notice: Subject to any disclaimer, the term of this patent is extended or adjusted under 35 U.S.C. 154(b) by 0 days.

(21) Appl. No.: 09/297,612

(22) PCT Filed: Nov. 12, 1997

(86) PCT No.: PCT/JP97/04112

§ 371 Date: May 3, 1999

§ 102(e) Date: May 3, 1999

(87) PCT Pub. No.: WO98/22230

PCT Pub. Date: May 28, 1998

(30) Foreign Application Priority Data

Nov. 15, 1996 (JP) .................................................. 8-304712

(51) Int. Cl.[7] .................................................. B08B 7/00
(52) U.S. Cl. ........................ 134/149; 134/153; 134/902; 396/611; 396/627
(58) Field of Search .............................. 134/33, 42, 149, 134/153, 902; 396/611, 627

(56) References Cited

U.S. PATENT DOCUMENTS 5,689,749 * 11/1997 Tanaka et al. ........................ 396/611
5,826,130 * 10/1998 Tanaka et al. ........................ 396/611

FOREIGN PATENT DOCUMENTS

| 4-96316 | 3/1992 | (JP) . |
| 6-291026 | 10/1994 | (JP) . |
| 7-66107 | 3/1995 | (JP) . |
| 8-17779 | 1/1996 | (JP) . |
| 8-124846 | 5/1996 | (JP) . |
| 9-97780 | 4/1997 | (JP) . |

* cited by examiner

*Primary Examiner*—Randy Gulakowski
*Assistant Examiner*—Saeed Chaudhry
(74) *Attorney, Agent, or Firm*—Christenen O'Connor Johnson Kindness PLLC

(57) ABSTRACT

The present invention provides a spin-processing apparatus less likely to produce a mist when an object to be processed is rotated. The apparatus is characterized in that it comprises a cup body having a lower cup and an upper cup mounted relative to the lower cup to be up/down movable, a rotation body retaining the object mounted within the cup body, a step motor rotationally driving the rotation body, an exhaust tube connected to a bottom of the lower cup to allow a gas in the cup body to be exhausted, and a scatter-proof cover provided within the upper cup and mounted above the rotation body.

10 Claims, 4 Drawing Sheets

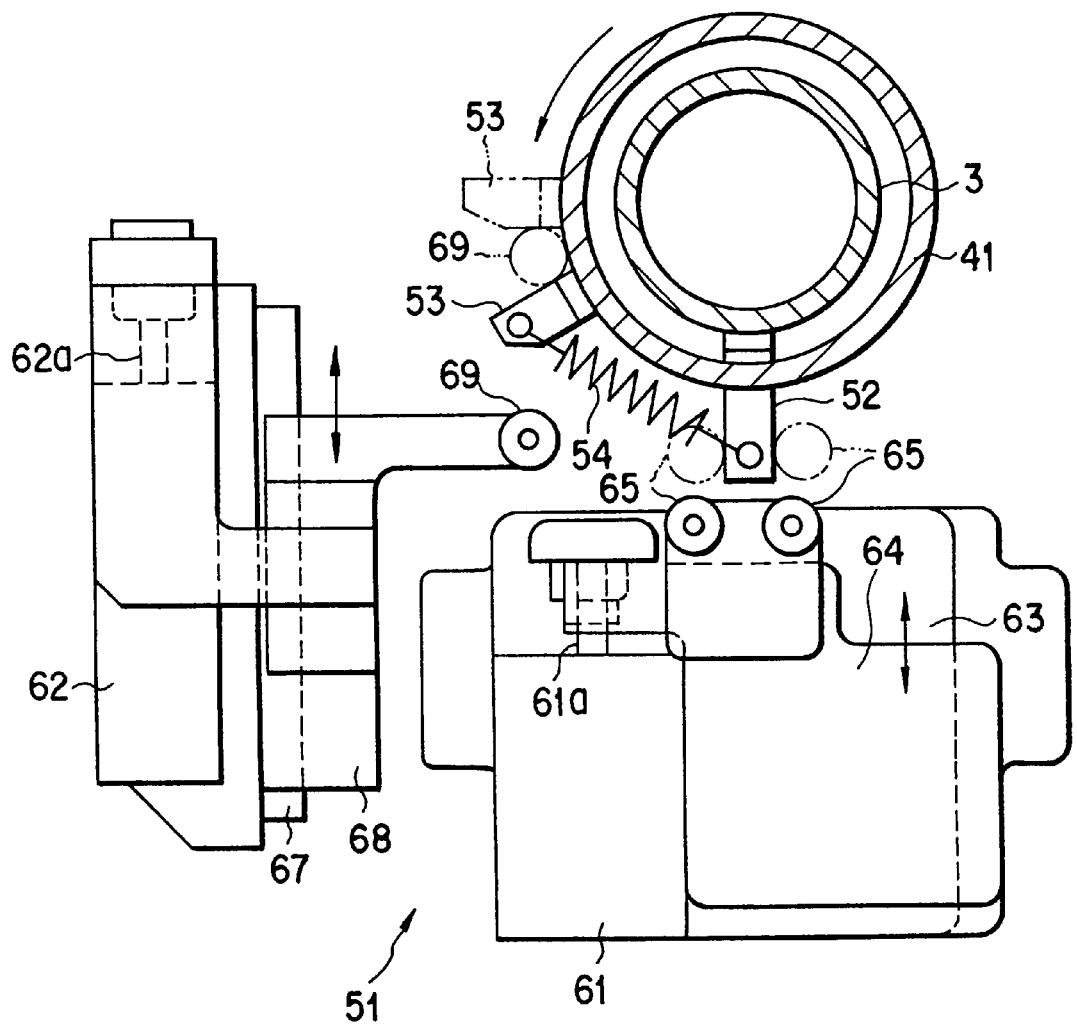
F I G. 4

SPIN-PROCESSING APPARATUS AND SPIN-PROCESSING METHOD

TECHNICAL FIELD

The present invention relates to a spin-processing apparatus and spin-processing method which wash-processes an object to-be-processed, while rotating it, and dry-processes the object.

BACKGROUND ART

In a liquid-crystal manufacturing apparatus and semiconductor manufacturing apparatus, for example, a step is required to wash, with a high purity level, an object to be processed, such as a glass substrate for a liquid crystal and semiconductor wafer. In order to wash and dry the above-mentioned material, it has been practiced that the object, while being spun, is washed by jetting a processing solution, such as pure water, and is dried while being spun without jetting the processing solution.

In order to perform such processing, use has been made of the spin-processing apparatus. The spin-processing apparatus has a cup body. Within the cup body a rotation body is provided which is rotationally driven by the rotation drive mechanism. The material is retained on the upper surface side of the rotation body. Above the cup body a nozzle is provided for jetting a processing solution onto the object.

Therefore, it is possible to wash-process the upper whole surface of the object by jetting the processing solution from the nozzle onto the object.

For example, in the case where the object is wash-processed with a chemical solution, after the wash-processing has been done with the chemical solution, the object is jetted with pure water as the processing solution to perform rinse-processing and, while being spun without supplying the processing solution, the rinse-processed material is dry-processed.

There is sometimes the case where, through the spinning of the rotation body and jetting of-the processing solution onto the object, a mist is produced and re-deposited onto the wash- and dry-processed object and the resultant object is contaminated.

It has been practiced that an exhaust tube is connected to the bottom of the cup body to allow the mist which is floated within the cup body to be sucked and exhausted and, by doing so, the mist is prevented from being redeposited on the object to be processed.

Incidentally, the mist is scattered at high speeds from the spinning material outwardly toward a diameter direction and collides against the inner wall surface of the cup body and is reflected. The mist reflected on the inner wall surface of the cup body is sucked into the above-mentioned exhaust tube and exhausted from within the cup body.

Since, however, the mist reflected on the inner wall surface of the cup body is indefinite in direction, part of the mist is scattered in the cup body to a site on which a suction produced at the exhaust tube is not exerted. For this reason, there is sometimes the case where the mist part is redeposited on the object without being borne on an air current in the cup body.

The above-mentioned cup body comprises a lower cup and an upper cup mounted on the lower cup to be up/down movable. In the case where the object is attached to and detached from the rotation body, the upper cup is lowered to expose the rotation body and the attachment/detachment is done by, for example, a robot.

According to the cup body thus structured, in order for the upper cup to have an up/down movable structure, a clearance has to be created between the lower cup and the upper cup. There is sometimes the case where when a suction force is created at the exhaust tube so as to discharge a gas within the cup body, outer air is sucked from the clearance between the lower cup and the upper cup. Since a dust is contained in the outer air passed through the clearance between the lower cup and the upper cut, the object to be processed is sometimes contaminated thereby.

It is to be noted that when the upper cup is moved in an up/down motion without creating a clearance between the lower cup and the upper cup, a dust is produced due to their slide motion and it is unavoidably deposited onto the object . From this viewpoint it is better to create a clearance.

In the case where a gas within the cup body is sucked and exhausted by the exhaust tube, if the direction in which an air flow is produced within the cup body and direction in which a suction is created by the exhaust tube within the cup body differ, there is sometimes the case where the mist within the cup body is less likely to flow smoothly into the exhaust tube. As a result, the mist is floated within the cup body and, sometimes, it is deposited on the object to be processed.

DISCLOSURE OF THE INVENTION

The object of the present invention is to provide a spin-processing apparatus and spin-processing method which prevents the contamination of a material to-be-processed by a mist produced within the cup body and the contamination of the object by outer air entering into the cup body from a clearance between a lower cup and an upper cup.

According to one preferred embodiment of the present invention, there is provided a spin-processing apparatus for spin-processing an object to be processed, characterized by comprising: a cup body having a lower cup and an upper cup so mounted relative to the low cup through a predetermined clearance, a rotation body provided within the cup body and retaining the object, drive means for rotationally driving the rotation body, an exhaust tube connected to a bottom of the lower cup to allow a gas within the cup to be drawn off and a scatter-proof cover provided at an inner wall surface of the upper cover to cover a circumference of the object retained by the rotation body.

By doing so, out of a mist scattered from a spinning material and reflected on the inner wall surface of the upper cup, part of the mist trying to be returned back to the upper surface side of the object collides against the outer peripheral surface of the scatter-proof cover and stays there. And it is less likely to be scattered on a circumference, so that it is liable to be sucked toward the exhaust tube side and the deposition of the mist onto the object is prevented.

According to one preferred embodiment of the present invention, there is provided a spin-processing apparatus for spin-processing an object to be processed, characterized by comprising a cup body having a lower cup and upper cut so mounted relative to the lower cup through a predetermined clearance to be up/down movable, a rotation body provided within the cup body and retaining the object to be processed, drive means for rotationally driving the rotation body, an exhaust tube connected to the bottom of the lower cup to allow a gas within the cup body to be drawn off, and an outer air ingress preventing cover for covering the clearance between the upper cup and the lower cup.

By doing so, even if a gas within the cup body is sucked by the exhaust tube so as to exhaust a mist within the cup body, outer air is prevented, by the outer air ingress preventing cover, from entering into the cup body from the clearance between the lower cup and the upper cup.

According to one preferred embodiment of the present invention, there is provided a spin-processing apparatus for spin-processing an object to be processed, characterized by comprising: a cup body having a lower cup and upper cup mounted relative to the lower cup through a predetermined clearance to be up/down movable, a rotation body provided within the cup body and retaining the object, drive means for rotatably driving the rotation body, an exhaust tube connected to the bottom of the lower cup to allow a gas in the cup body to be drawn off, and a guide member mounted on an inner bottom of the cup body to guide a gas in the cup body into the exhaust tube.

By doing so, the mist produced within the cup body and outer air entering on the inner wall surface side of the guide member from the lower cup are guided by the guide member and exhausted from the cup body into the exhaust tube in a better state.

According to one preferred embodiment of the present invention, there is provided a spin-processing method for spin-processing an object to-be-processed rotated a rotation body provided within a cup body, characterized by comprising the steps of:

lowering an upper cup and supplying the object on the rotation body, the cup body having a lower cup and upper cup provided relative to the lower cup through a predetermined clearance to be up/down movable;

after supplying the object to the rotation body, lifting the upper cup and covering a circumference of the object;

rotating the rotation body, while drawing off a gas within the cup body, and processing the object; and, after processing the object, lowering the upper cup and picking up the object from the rotation body.

By doing so, when the object is spun and processing is done while exhausting a gas within the cup, outer air is prevented from entering into the cup body and the object is prevented from being contaminated.

BRIEF DESCRIPTION OF THE INVENTION

FIG. 4 is a front view showing a releasing mechanism thereof;

BEST MODE OF CARRYING OUT THE INVENTION

One embodiment of the present invention will be explained below with reference to the accompanying drawings.

Figure 1:
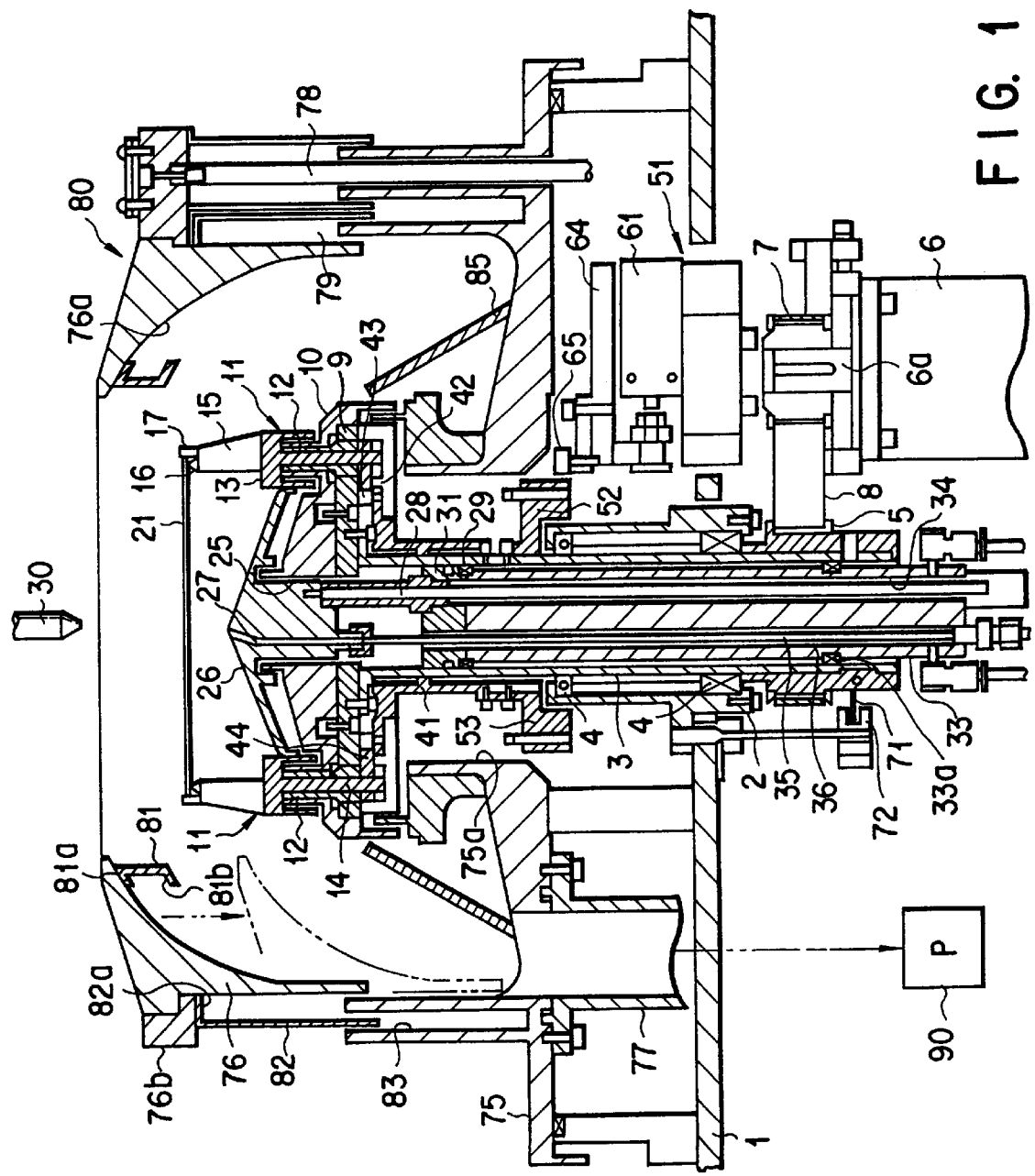
FIG. 1 is a cross-sectional view showing a schematic structure of a whole apparatus according to one embodiment of the present invention.

An spin-dry processing apparatus of the present invention as shown in FIG. 1 has a body base 1. A cylindrical support 2 is provided in the body base 1 in a manner to extend through the body base 1 in an up/down direction. A cylindrical rotation shaft 3 is so provided in the support 2 as to have its intermediate section rotatably supported by bearings 4.

The lower end portion of the above-mentioned rotation shaft 3 is projected out of the support 2 such that a driven pulley 5 is provided at the lower end portion of the shaft 3. A step motor 6 is provided in the neighborhood of the driven pulley 5. A drive pulley 7 is fitted over a rotation shaft 6a of a step motor 6 and a belt 8 is provided in a tensioned way between the drive pulley 7 and the driven pulley 5. Therefore, if the above-mentioned step motor 6 is operated, then the rotation shaft 2 is rotationally driven.

Figure 2:
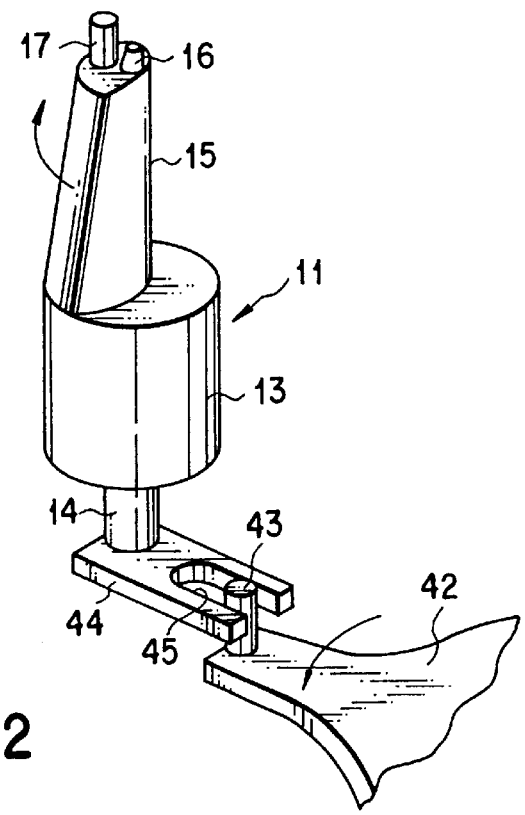
FIG. 2 is a perspective view showing a retaining member thereof.

A rotation body 9 with a die 10 joined to an upper surface of the rotation shaft 3 is mounted as an integral unit relative to an upper end of the rotation shaft 3. Four retaining members 11 are arranged, as upright members, at a 90° interval in a circumferential direction of the rotation body 9 such that these are rotatable through a bush 12. The retaining member 11 has a cylindrical section 13 as shown in FIG. 2. This cylindrical section 13 has its upper end closed and its lower end opened. A support 14 is downwardly provided from a lower end of the cylindrical section 13. The support shaft 14 is rotatably supported at the above-mentioned bush 12 (shown in FIG. 1).

A support section 15 with a streamlined cross-section is provided integral with an upper surface of the cylindrical section 13. A support pin 16 and locking pin 17 higher than the support pin 16 are provided upright on an top surface of the support section 15. The support pin 16 is situated substantially in alignment with a center axis of the support 14 and the locking pin 17 is so provided as to be displaced a predetermined dimension off an axis of the support axis.

A semiconductor wafer 21 is retained as an object to-be-processed on the four retaining members 11, as shown in FIG. 1, in the above-mentioned arrangement. that is, the semiconductor wafer 21 has its marginal edge lower surface portion supported on the support pins 16. With the semiconductor wafer 21 supported on the support pins 16, the retaining member 11 is rotated as will be set out below. By doing so, the locking pins 17 provided on the retaining members 11 are eccentrically rotated and abut against the outer peripheral surface of the semiconductor wafer 21, so that the semiconductor wafer 21 is retained without being displaced in a diameter direction.

A through hole 25 is provided, as shown in FIG. 1, between the rotation body 9 and the die 10. A nozzle body 26 is inserted into the through hole 25 in a non-contacting state. The nozzle body 26 has a conical configuration and a nozzle bore 27 has its one end opened at the upper surface of the nozzle body 26.

An upper end of a support shaft 28 is connected to a lower end surface of the nozzle body 26 and the upper portion of the support shaft 28 is retained on a bracket 31. The bracket 31 is rotatably supported by a boarding 29 at the rotation shaft 3. That is, the nozzle body 26 is retained at the bracket 31 through the support shaft 28.

A housing 33 is inserted beneath the bracket 31 in the above-mentioned rotation shaft 3. The upper end of the housing 33 is coupled to the bracket 31 and the lower end portion of the housing 33 is supported by a bearing 33a at the rotation shaft 3 such that it is rotatable.

The above-mentioned housing 33 has a first through hole 34 through which the support shaft 28 extends and a second through hole 36 through which a supply tube 35 connected at one end to the nozzle bore 27 extends. The other end of the supply tube 35 communicates with a supply section of supplying a processing solution, such as a chemical solution and rinse solution, not shown. Therefore, a processing solution can be jetted from the nozzle bore 27 to a lower surface of the semiconductor wafer 21.

A nozzle 30 is arranged above the semiconductor wafer 21 retained at the rotation body 9. The nozzle 30 communicates with a supply section of supplying a processing solution, such as a chemical solution and rinse solution, not shown.

Thus the processing solution can be jetted on the upper and lower surfaces of the semiconductor wafer 21 retained at the retaining member 11. That is, the semiconductor wafer 21 can has its upper and lower surfaces wash- and rinse-processed before being dry-processed.

It is to be noted that, since the nozzle body 26 is held by the support shaft 28 and arranged in a not-contacted state relative to the rotation shaft 3, the rotation body 9 is not rotated even if it is rotated as one unit relative to the rotation shaft 3.

Figure 3:
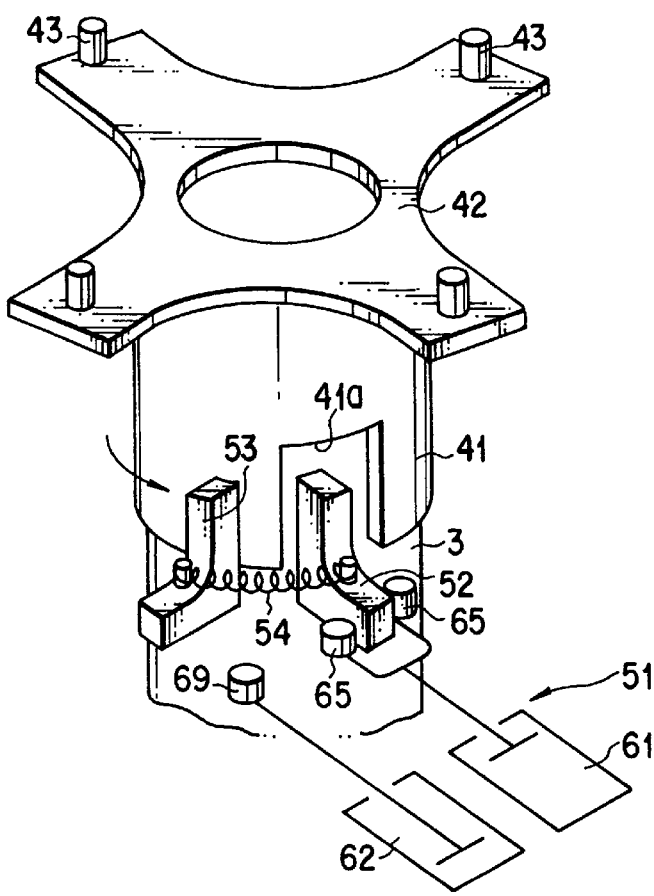
FIG. 3 is a perspective view showing a relation between a rotation shaft and a locking cylinder.

On the lower surface side of the above-mentioned rotation body 9, a locking cylinder 41 is rotatably provided at the upper outer peripheral surface portion of the rotation shaft 3. As shown in FIG. 3, a flange 42 is provided on an upper end of the locking cylinder 41 and four latching pins 43 are projected at a 90° interval in a circumferential direction.

As shown in FIG. 2, the latching pin 43 engages an engaging groove 45 opened at one end of a lever 44. The other end of the lever 44 is mounted on the lower end of the support shaft 14 of the retaining member 11. Therefore, when the locking cylinder 41 is counter-clockwise rotated as indicated by an arrow in FIGS. 3 and 4 and the lever 44 is rotated by the latching pins 43 in the same direction, then the retaining member 11 can be rotated, in a clockwise direction as indicated by an arrow in FIG. 2, about the support shaft 14 connected to the lever 44.

Since, by doing so, the locking pin 17 is eccentrically rotated, the locking pins 17 abut against the outer peripheral face of the semiconductor wafer 21 supported by the support pins 16, so that the support state of the semiconductor wafer 21 can be locked. That is, the support wafer 21 supported by the support pins 16 is prevented from being displaced in the diameter direction. If the locking cylinder 41 is rotated clockwise, it is possible to release the locked state of the semiconductor wafer 21 by the locking pin 17.

The locking and unlocking of the semiconductor wafer 21 by the locking pins 17, that is, the rotation of the locking cylinder 41, are done by a releasing mechanism 51. As shown in FIGS. 3 and 4, this releasing mechanism 51 has a first latching piece 52 provided on the outer peripheral surface of the rotation shaft 3 and situated in a cutout 41a in the locking cylinder 41 and a second latching piece 53 provided in the outer peripheral surface of the locking cylinder 41.

A spring 54 is stretched between the first latching piece 52 and the second latching piece 53. This spring 54 urges the locking cylinder 41 toward the direction of the first latching piece 52 through the second latching piece 53. That is, the locking cylinder 41 is urged in a counter-clockwise direction as indicated by an arrow in FIG. 3.

Since, by doing so, the locking cylinder 41 is normally urged by an urging force of the spring 54 toward the counterclockwise direction, the retaining member 11 is clockwise rotated through the latching pin 43 and lever 44, so that the locking pin 17 is set in a locked state in which it abuts against the outer peripheral face of the locking pin 17.

The releasing of the locked state of the semiconductor wafer 21 by the locking pins 17 is effected by a first cylinder 61 and second cylinder 62 in the above-mentioned releasing mechanism 51 situated near the above-mentioned step motor 6.

That is, as shown in FIG. 4, a first movable body 64 is slidably supported by a first linear guide 63 in those directions of arrows on the first cylinder 61 side. The first movable body 64 is coupled to a rod 61a of the first cylinder 61. By doing so, the first movable body 64 is adapted to be reciprocably driven along the first linear guide 63 by operating the first linear guide 63.

A pair of sandwiching rollers 65 are provided at the forward end of an upper surface of the first movable body 64 such that it is spaced a predetermined distance away from each other. When the first movable body 64 is driven in a forward direction, the sandwiching rollers 65 hold the first latching piece 52 as indicated by dash dot lines. By doing so, the rotation shaft 3 is prevented from being rotated.

On the second cylinder 62 side, a second movable body 68 is mounted by a second linear guide 67 such that it is slidable in those directions of arrows. A pressing roller 69 is rotatably mounted on the forward end of an upper surface of the second movable body 68. Thus, the pressing roller 69 is driven by the second cylinder 62 in a forward/backward direction.

When, with the first latching piece 52 held between the paired sandwiching rollers 65, the second cylinder 62 is operated to cause the second movable body 68 to be driven in a forward direction, the pressing roller 69 mounted on the forward end portion of the second movable body presses the second latching piece 53 provided on the locking cylinder 41.

By doing so, the locking cylinder 41 is rotated against an urging force of the spring 54 and, through the latching pin 43 and lever 44, the retaining member 11 is rotated in a direction opposite to that at a locking time. Therefore, the locking pin 17 is eccentrically rotated in a counter-clockwise direction, so that the locked state of the semiconductor wafer 21 is released.

As shown in FIG. 1, a dog 71 is mounted on the outer peripheral surface of the lower end portion of the rotation shaft 3 and the dog 71 is detected by a microphotosensor 72. The rotation angle of the rotation shaft 3 by the above-mentioned step motor 6 is controlled by a detection signal of the microphotosensor 72. That is, when the locked state of the semiconductor wafer 21 is released, the rotation angle of the rotation shaft 3 is so controlled as to allow the first latching piece 52 and second latching piece 53 to be set to predetermined positions relative to the first and second cylinders 61 and 62.

A cup body 80 is provided above the upper surface side of the body base 1. The cup body 80 has a bottomed lower cup 75 with the rotation shaft 3 extending through a through hole 75a in the bottom section and a ring-like upper cup 76 whose outer peripheral surface defines a predetermined clearance 79 relative to an inner wall surface of the lower cup 75. A rod 78 of an up/down drive cylinder not shown is coupled to the upper cup 76 and, through the operation of this cylinder, the upper cup 76 is up/down driven.

The above-mentioned cup 76 has its up/down motion stroke so set that it, being in a lifted position, covers the outer peripheral surface of the semiconductor wafer 21 retained by the retaining member 11 and, being a lowered position as indicated by a chain line, has its upper end set to a lower position than the upper surface of the semiconductor wafer 21.

Therefore, with the upper cup 76 lowered to the position indicated by the chain line in FIG. 1, a not-yet-processed semiconductor wafer 21 is supplied to the retaining members 11 mounted on the rotation body 9, by a robot not shown, and a semiconductor wafer 21 processed with a processing solution and then dry-processed can be picked up thereby.

Further, to the bottom of the lower cup 75, a plurality of exhaust tubes 77 are connected at a predetermined interval, for example, at a 90° interval, in a circumferential direction. The exhaust tubes 77 are connected to a suction pump 90 through a gas/water separator for separating a gas and processing solution, not shown, from each other. Therefore, the processing solution, mist, gas, etc., in the cup body 80 can be sucked and discharged under a suction force of a suction pump 90 connected to the exhaust tube 77.

A concave, circular arc surface 76a is formed on an inner wall surface of the upper cup 76 and, above the circular arc surface 76a, a cylindrical scatter-proof cover 81 is provided which covers an outer peripheral surface portion somewhat higher than the upper surface of the semiconductor wafer 21 retained by the retaining member 11. This scatter-proof cover 81 has its lower end set somewhat higher than, for example, about a few millimeters to a few tens of millimeters, preferably about 10 mm higher than, the upper surface of the semiconductor wafer 21.

The scatter-proof cover 81 is made of a synthetic resin of a better corrosion resistance, such as a fluorine resin, and formed as having a cylindrical configuration. An upper bending section 81a is formed on the upper end portion of the scatter-preventing cover 81 and, for example, bonded or screwed to the cylindrical arc section 76a of the upper cup 76. Further, at the lower end portion of the scatter-proof cover 81, a lower bending section 81b is formed which is bent outwardly of the diameter direction.

When the rotation body 9 is rotationally driven and the semiconductor wafer 21 retained by the retaining members 11 is rotated as one unit, a processing solution from the semiconductor wafer 21 is scattered as a mist and the mist is reflected on the circular arc surface 76a of the upper cup 76.

The mist colliding against the circular surface 76a is mostly reflected downwardly because the circular arc surface 76a is concave, but there is sometimes the cases that some is moved upwardly and reflected. The mist moved upwardly and reflected at the circular arc surface 76a collides against the outer peripheral surface of the scatter-proof cover 81, so that the mist is prevented from being deposited on the semiconductor wafer 21 retained at the retaining members 11.

Further, the lower end portion of the scatter-proof cover 81 provides the lower bending section 81b bent outwardly toward the diameter direction. For this reason, some of the mist scattered from the semiconductor wafer 21 collides against the inner wall surface of the lower bending section 81b. The mist colliding against the inner wall surface is moved and reflected downwardly. For this reason, even if the scatter-proof cover 81 is provided, the reflection of the mist on the inner wall surface and return of it back to the semiconductor wafer 21 are prevented by the lower bending section 81b.

That is, since a distance between the lower end of the scatter-proof cover 81 and the upper surface of the semiconductor wafer 21 is set to be narrower, the mist reflected on the circular arc surface 76a of the upper cup 76 is prevented from being redeposited on the upper surface of the semiconductor wafer 21. On the other hand, however, some of the mist collides against the lower end portion of the scatter-proof cover 81. However, the lower end portion of the scatter-proof cover 81 is provided at the lower bending section 81b and the mist colliding there is reflected downwardly, so that it is prevented from being deposited on the semiconductor wafer 21.

An outer air ingress preventing cover 82 is mounted on the outer peripheral surface of the upper cup 76. The outer air ingress preventing cover 82, like the scatter-proof cover 81, is made of a synthetic resin of a better corrosion resistance, such as a fluorine resin, and formed to a cylindrical configuration. An L-shaped bending section 82a is formed on the upper end of the outer air ingress preventing cover 82 and the bending section 82a is mounted on, and fixed to, a mount section 76b at the upper portion of the outer peripheral surface of the upper cup 76.

On the other peripheral wall of the lower cup 75 a receiving groove 83 is formed around a full circumference of the cup as an open-topped one. In the lifted state of the upper cup 76, the lower end portion of the outer air ingress preventing cover 82 is situated in the receiving groove. By doing so, the upper end portion of the lower cup 75, that is, the outer peripheral portion of the overlapped lower and upper cups 75 and 76 in the clearance 79, is covered by the lower end portion of the outer air ingress preventing cover 82.

By covering the above-mentioned clearance 79 with the outer air ingress cover 82, the outer air is prevented from entering into the cup body 80 via the clearance 79.

With the outer air ingress preventing cover 82 inserted into the receiving groove 83, a labyrinthine structure is provided at the outer air ingress preventing cover 82 and an area where the receiving groove 83 of the circumferential wall of the lower cup 75 is provided. For this reason, with the outer air ingress preventing cover 82 inserted into the receiving groove 83, it is possible to, under a better condition, inhibit the outer air from entering via the clearance 79.

With a liquid kept in the receiving groove 83 and the lower end portion of the outer air ingress preventing cover 82 immersed in the liquid, an air-tightness is kept between the outer air ingress preventing cover 82 and the lower cup 75, so that an air ingress via the clearance 79 can be positively prevented.

Since the upper surface of the upper cup 76 is opened, the outer air enters into the cup body 80. However, the spin processing apparatus is normally installed within a clean room (not shown). In the clean room, pure air not containing any particles flows from a ceiling toward a floor surface. Since, therefore, the pure water flows from the upper opening of the upper cup 76 into the inside of the cup body 80, the semiconductor wafer 21 is almost not contaminated by the air.

Figure 6:
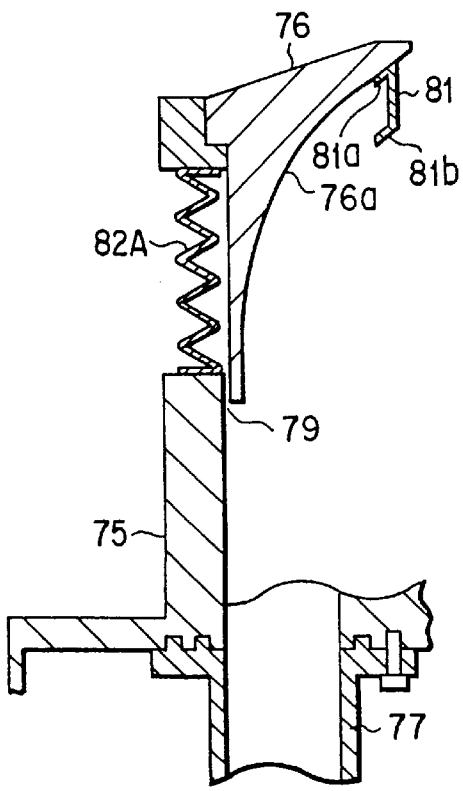
FIG. 6 is a cross-sectional view showing a portion of a variant of an outer air ingress preventing cover.

It may be possible that, as shown in FIG. 6, the outer air ingress preventing cover 82A is formed as a cylindrical bellows structure with the use of extendible/contractible rubber and synthetic resin in which case its lower end is connected to the upper end of the lower cup 75 and its upper end is connected to the mount section 76b of the upper cup 76.

A guide member 85 is provided on the inner bottom of the lower cup 75 and formed to a top-opened umbrella-like configuration with the use of a synthetic resin of a better corrosion resistance such as a fluorine resin. That is, the guide member 85 is made smaller at its upper end face than at its lower end face to provide a cylindrical configuration inclined from the upper end toward the lower end outwardly in a diameter direction.

The guide member 85 has its upper end inner wall surface situated near the outer peripheral surface of the rotation body 9 and its lower end situated at an intermediate portion in the diameter direction of the opening of the exhaust tube 77 connected to the bottom of the lower cup 75.

By exerting a suction force of the suction pump 90 on the cup body 80 a mist and gas within the cup body 80 are guided on the inclined outer peripheral surface of the guide member 85 and smoothly exhausted into the exhaust tube 77. Further, since the lower end of the guide member 85 is situated at the intermediate portion in the diameter direction of the exhaust tube 77, a suction force of the suction pump 90 acts, via the exhaust tube 77, upon both the outer peripheral surface side and the inner wall surface side. For this reason, a mist entering not only on the outer peripheral side but also on the inner wall surface side of the guide member 85, as well as a gas entering on the inner wall surface side from the through hole 75a of the lower cup 75, is exhausted from the exhaust tube 77 under a better condition.

In the case where the semiconductor wafer 21 is wash-processed and then dry-processed by the spin dry processing apparatus thus structured, first the upper cup 76 is lowered and a semiconductor wafer 21 is supplied to the rotation body 9 (retaining members 11). Then the upper cup 76 is lifted and the marginal edge portion of the semiconductor wafer 21 retained at the rotation body 9 is covered. And the rotation body 9 is rotated, while sucking an inside of the cup body 80 by the suction pump 90, and a processing solution is supplied to the upper and lower surfaces of the semiconductor wafer 21. By doing so, the above-mentioned semiconductor wafer 21 has its upper and lower surfaces, for example, wash-processed by the above-mentioned processing solution.

After being wash-processed, the supplying of the processing solution is stopped and the rotation body 9 is rotated at a high speed to cause the processing solution which is deposited onto the semiconductor wafer 21 to be scattered. And the semiconductor wafer 21 is dry-processed.

The processing solution is jetted to the rotating semiconductor wafer 21 and the semiconductor wafer 21 is dry-processed, so that the processing solution is scattered about as a mist and the mist collides against the circular arc surface 76a of the upper cup 76. Since the circular arc surface 76a is concave, the mist scattered on the semiconductor wafer 21 and colliding against the circular arc surface 76a is mostly moved downwardly and reflected. For this reason, the mist flows along the outer peripheral surface of the guide member 85 under a suction force of the suction pump 90 and is exhausted smoothly into the exhaust tube 77.

Part of the mist reflected on the circular arc surface 76a of the upper cup 76 is reflected upwardly depending upon the angle at which it is incident on the circular arc surface 76a. However, the mist reflected upwardly collides against the outer peripheral surface of the scatter-proof cover 81 provided at the upper portion of the upper cup 76. For this reason, the mist reflected upwardly on the circular arc surface 76a of the upper cup 76 is prevented from being deposited onto the semiconductor wafer 21.

The lower end of the above-mentioned scatter-proof cover 81 is formed at the lower bending section 81b bent outwardly toward the diameter direction. For this reason, the mist scattering somewhat upwardly from the upper surface of the semiconductor wafer 21 and colliding against the inner wall surface of the lower bending section 81b is reflected downwardly. And the mist is guided on the outer peripheral surface of the guide member 85 and exhausted into the exhaust tube 77, so that it is not deposited to the semiconductor wafer 21.

In this way, the mist scattered from the rotating semiconductor wafer 21 is, under a better condition, prevented from being reflected on the inner wall surface of the upper cup 76 and deposited onto the semiconductor wafer 21 because the inner wall surface of the upper cup 76 is made concave and the scatter-proof cover 81 is provided at the upper cup 76.

Since the mist exhausted into the exhaust tube 77 from within the cup body 80 is smoothly guided by the outer peripheral surface of the inclined circumferential wall of the guide member 85, the mist is liable to be exhausted from within the cup body 80 due also to being done so.

The mist generated at the wash-processing time by the scatter-proof cover 81 and guide member 85 is smoothly and positively exhausted from within the cup body 80 it follows that at the dry-processing time, almost no mist stays within the cup body. Therefore, the semiconductor wafer 21 after being dry-processing following the wash-processing is prevented from being contaminated by the mist.

Since the cup body 80 is such that the semiconductor wafer 21 is attached to, and detached from, the rotation body 9 by lowering the upper cup 76, the above-mentioned clearance 79 is secured between the lower cup 75 and the upper cup 76. However, there is a risk that the outer air containing particles will enter into the inside of the cup body 80 from the clearance 79, that is, from the overlapped area of the lower cup 75 and upper cup 76.

However, the overlapped area of the respective cups 75, 76 is covered by the outer air ingress preventing cover 82 and, for this reason, the outer air is prevented from entering from the clearance 79 of the above-mentioned outerlapped area into the cup body 80, so that there is no possibility that the outer air containing the particles will be deposited onto the semiconductor wafer 21.

Further, the guide member 85 provided on the inner bottom of the lower cup 75 has its lower end situated at the intermediate way in a diameter direction of the exhaust tube 77. For this reason, a suction force of the suction pump 90 acting inside the cup body 80 via the exhaust tube 77 acts not only on the outer peripheral surface side but also on the inner wall surface side of the guide member 85.

Since the suction force acting on the inner wall surface side of the guide member 85 sucks the outer air entering into the cup body 80 from the through hole 75a of the lower cup 75 without being scattered within the cup body 80, the particles contained in the outer air entering from the above-mentioned through hole 75a is prevented from being deposited onto the semiconductor wafer 21.

Figure 5:
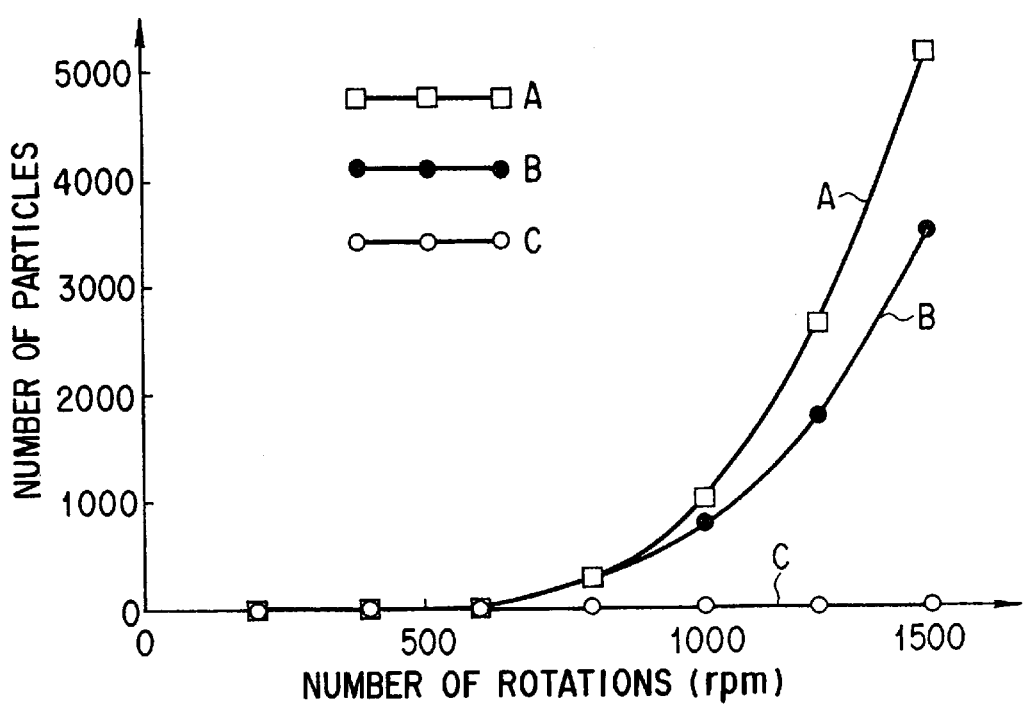
FIG. 5 shows a graph showing a result of experiments thereof.

FIG. 5 shows a result of counting by a particle counter of particles over the upper surface of the semiconductor wafer 21 retained at the rotation body 9. The curve A in FIG. 5 represents the case where there is neither any scatter-proof cover 81 nor any outer air ingress preventing cover 82. In this case, if the number of revolutions of the rotation body 9 rises to 600 rpm, the number of particles starts to increase and, at 150 rpm, the number of particles per given unit area sharply increased to about 5100.

The curve B represents the case where only scatter-proof cover 81 is provided. In this case, in comparison with the curve A, an increasing rate of particles was low against an increase in number of the rotation body 9 and, when the number of rotations was 1500 rpm, the numbers of particles per given unit area was about 3500. That is, it may be considered that the reflection of the mist on the upper cup 76 and deposition of it onto the semiconductor wafer 21 can be suppressed by providing the scatter-proof cover 81.

The curve C represents the case where the scatter-proof cover 81 and outer air ingress preventing cover 82 are provided. In this case, even where the number of revolutions of the rotation body 9 was 1500 rpm, almost no particles were detected over the upper surface of the above-mentioned semiconductor wafer 21. That is, it is considered that, by providing the scatter-proof cover 81 and outer air ingress preventing cover 82, the contamination of the semiconductor wafer 21 is reduced with the above-mentioned effect by the scatter-proof cover 81 and outer air ingress preventing effect by the outer air ingress preventing cover 82.

INDUSTRIAL APPLICABILITY

The present invention is not restricted to the above-mentioned embodiment and various modifications of the present invention can be made. For example, although the semiconductor wafer is listed, as an object to be processed, in the above-mentioned one embodiment, even if a rectangular glass substrate for use in a liquid crystal device is used instead of the semiconductor substrate, it is possible to prevent it from being contaminated when processing is performed on it with the apparatus of the present invention.

What is claimed is:

1. A spin-processing apparatus for spin-processing an object to be processed, characterized by comprising:
    a cup body having a lower cup and a upper cup so mounted relative to the lower cup through a predetermined clearance as to be up/down movable;
    a rotation body provided within the cup body and retaining the object to be processed;
    drive means for rotationally driving the rotation body;
    an exhaust tube connected to the bottom of the lower cup to allow a gas in the cup body to be drawn off; and
    a scatter-proof cover provided at an inner wall surface of the upper cup to cover a circumference of the object retained by the rotation body, the scatter-proof cover being ring-like and having a lower end set to be higher in position than an upper surface of the object retained on the rotation body, and the lower end of the scatter-proof cover being curved outwardly toward a diameter direction.

2. A spin-processing apparatus according to claim 1, characterized in that the inner wall surface of the upper cup is a concave, circular arc surface.

3. A spin-processing apparatus according to claim 1, characterized in that the clearance between the upper cup and the lower cup is covered with an outer air ingress preventing cover.

4. A spin-processing apparatus according to claim 1, characterized in that a guide member is provided at an inner bottom of the cup body to guide the gas in the cup body into the exhaust tube.

5. A spin-processing apparatus according to claim 1, characterized in that the clearance between the upper cup and the lower cup is covered with an outer air ingress preventing cover and a guide member is provided at an inner bottom of the cup body to guide the gas in the cup body into the exhaust tube.

6. A spin-processing apparatus for spin-processing an object to be processed, characterized by comprising;
    a cup body having a lower cup and an upper cup so mounted relative to the lower cup through a predetermined clearance as to be up/down movable;
    a rotation body provided within the cup body and retaining the object to be processed;
    drive means for rotationally driving the rotation body;
    an exhaust tube connected to the bottom of the lower cup to allow a gas in the cup body to be drawn off; and
    an outer air ingress preventing cover for covering the clearance between the upper cup and the lower cup, the outer air ingress preventing cover being formed to a cylindrical configuration and having an upper end mounted on an outer peripheral surface of the upper cup, a receiving groove being provided at a circumferential wall of the lower cup and having an open top, and the outer air ingress preventing cover being slidably received in the receiving groove and having a lower end portion whose length is so set as to be situated in the receiving groove with the upper cup in a lifted state.

7. A spin-processing apparatus according to claim 6, characterized in that a guide member is provided at an inner bottom of the cup body to guide the gas in the cup body into the exhaust tube.

8. A spin-processing apparatus according to claim 7, characterized in that the guide member is formed to a cylindrical configuration inclined outwardly toward a diameter direction as a circumferential wall of the guide member goes from an upper end to a lower end and the lower end of the guide member is located at an intermediate portion in the diameter direction of the exhaust tube.

9. A spin-processing apparatus for spin-processing an object to be processed, characterized by comprising:
    a cup body having a lower cup and a lower cup so mounted relative to the lower cup through a predetermined clearance as to be up/down movable;
    a rotation body provided within the cup body and retaining the object to be processed;
    drive means for rotationally driving the rotation body;
    an exhaust tube connected to the bottom of the lower cup to allow a gas in the cup body to be drawn off; and
    an outer air ingress preventing cover for covering the clearance between the upper cup and the lower cup, the outer air ingress preventing cover being formed as an extensible/contractible bellows and having one end mounted on an outer peripheral surface of the lower cup and the other end mounted on the outer peripheral surface of the upper cup.

10. A spin-processing apparatus according to claim 9, characterized in that a guide member is provided at an inner bottom of the cup body to guide the gas in the cup body into the exhaust tube.

* * * * *

UNITED STATES PATENT AND TRADEMARK OFFICE
CERTIFICATE OF CORRECTION

PATENT NO. : 6,192,903 B1
DATED : February 27, 2001
INVENTOR(S) : T. Doi et al.

Page 1 of 1

It is certified that error appears in the above-identified patent and that said Letters Patent is hereby corrected as shown below:

Title page, column 2,
Item [74], Attorney, Agent, or Firm "Christenen" should read -- Christensen --

Column 11,
Line 30, (claim 1, line 3), "a upper" should read -- an upper --

Column 12,
Line 5 (claim 6, line 5), "comprising;" should read -- comprising: --
Line 39 (claim 9, line 3), "a lower cup and a lower cup" should read -- a lower cup and an upper cup --

Signed and Sealed this

Sixth Day of November, 2001

Attest:

NICHOLAS P. GODICI
Attesting Officer
Acting Director of the United States Patent and Trademark Office